LOGIC CIRCUIT FOR USE WITH ADAPTION KITS AND LIKE MISSILE DEVICES

Filed Oct. 26, 1967 2 Sheets-Sheet 1

INVENTOR
EDWARD D. PADGETT
BY Harry M. Saragovitz
Edward J. Kelly, Herbert Berl
& S. Dubroff
ATTORNEYS Nov. 10, 1970 E. D. PADGETT 3,539,833

LOGIC CIRCUIT FOR USE WITH ADAPTION KITS AND LIKE MISSILE DEVICES

Filed Oct. 26, 1967 2 Sheets-Sheet 2

INVENTOR
EDWARD D. PADGETT
BY Harry M. Saragovitz, Edward J. Kelly, Herbert Berl & S. Dubroff
ATTORNEYS United States Patent Office 3,539,833
Patented Nov. 10, 1970

3,539,833

LOGIC CIRCUIT FOR USE WITH ADAPTION KITS AND LIKE MISSILE DEVICES

Edward D. Padgett, Morristown, N.J., assignor to the United States of America as represented by the Secretary of the Army Filed Oct. 26, 1967, Ser. No. 678,461
Int. Cl. H03k *17/72*
U.S. Cl. 307—252 10 Claims

ABSTRACT OF THE DISCLOSURE

A semi-conductor logic circuit having a conditioned amplifier which applies phase-coded pulses to silicon-controlled switches to obtain reliable scheduled initiation of the switches into the conduction state. The initiation of the switches allows a plurality of previously open circuited load devices to conduct as though they were connected in a parallel configuration.

Figure 1:
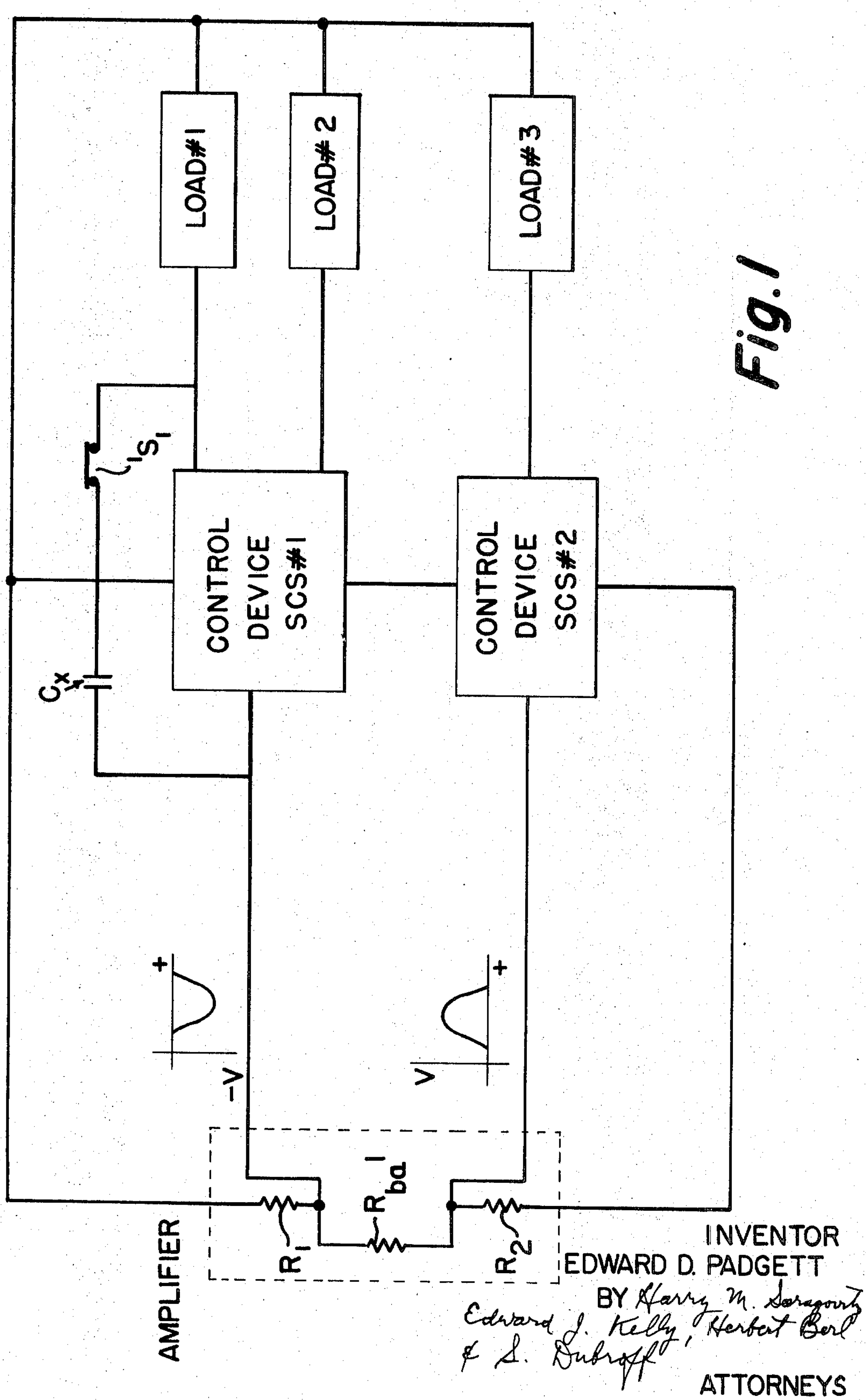

The invention described herein may be manufactured, used, and licensed by or for the Government for governmental purposes without the payment to me of any royalty thereon.

The present invention relates to a direct-coupled semiconductor logic system and circuit, and particularly, to a logic circuit provided with a necessary conditioning network to obtain reliable scheduled firing or initiation to the conduction state of solid state or silicon-controlled switches which in turn allow a plurality of otherwise open circuited load devices to conduct electrical energy. Presently, silicon-controlled switches are employed for purposes of fuzing, safing, arming and firing detonating systems and adaption kits in missiles for activation of warheads on programmed schedules.

In the past, both mechanical and electrical timers have been used for detonation and navigation applications in missiles. The main disadvantage of mechanical timers is that the contacts used introduce errors in the system and sometimes are rendered useless by corrosion deposits acquired during storage and non-use. The main disadvantage of electrical timers, using silicon controlled switches, is that they are susceptible to being fired or turned on by unwanted voltage variations or random signals. The semi-conductor or solid state circuit of the present invention is directed to solving these problems, and is found to substantially eliminate the above mentioned disadvantages of the prior art by providing safety, protection, reliability and simplicity heretofore not present in detonation and navigation applications.

The present invention provides greater reliability in applications wherever fidelity of control and operational precision are essential, such as to provide new and better detectors, for use in the generation of electrical pulses, and to accomplish functions vital to the flight of a missile.

In general, the inventive apparatus comprises a pulse conditioned amplifier and logic circuit which contains a plurality of solid state or silicon-controlled switches connected in series. The pulse conditioned amplifier provides pulses to insure the reliable scheduled initiation into the conduction state of the silicon-controlled switch devices. Responsive to the conduction of the switches a plurality of load devices are rendered conductive and appear operationally as though they were originally connected in a parallel configuration.

The inventive apparatus includes among its operational elements, a pulse conditioned amplifier consisting preferably of three direct coupled transistors of the low noise and moderate gain type. The output stage of the amplifier acts as a phase inverter to provide a plurality of coded pulses of suitable polarity, magnitude and width to accomplish the firing of the silicon-controlled switches referred to above.

The proper pulses are applied through directly coupled means to the control electrodes of the silicon controlled switches, either PNPN or NPNP devices, to cause switching from the Off to the On states; that is, the conduction states of the devices. At least one of the pulses is coded negative in polarity and at least one other is coded positive. These pulses are applied directly to the control gates of the silicon controlled switches, through diode and resistor networks. The excitation caused by the applied pulses results in the triggering of the semiconductor devices into their conduction states.

A plurality of load circuits are connected to the semiconductor switches and are open circuited or blocked when the switches are in their normally non-conducting states. When the semiconductor switches are triggered or turned on, this switch closing permits the conduction of current through the load circuits, which might achieve, for example, the firing of an adaption kit.

Figure 2:
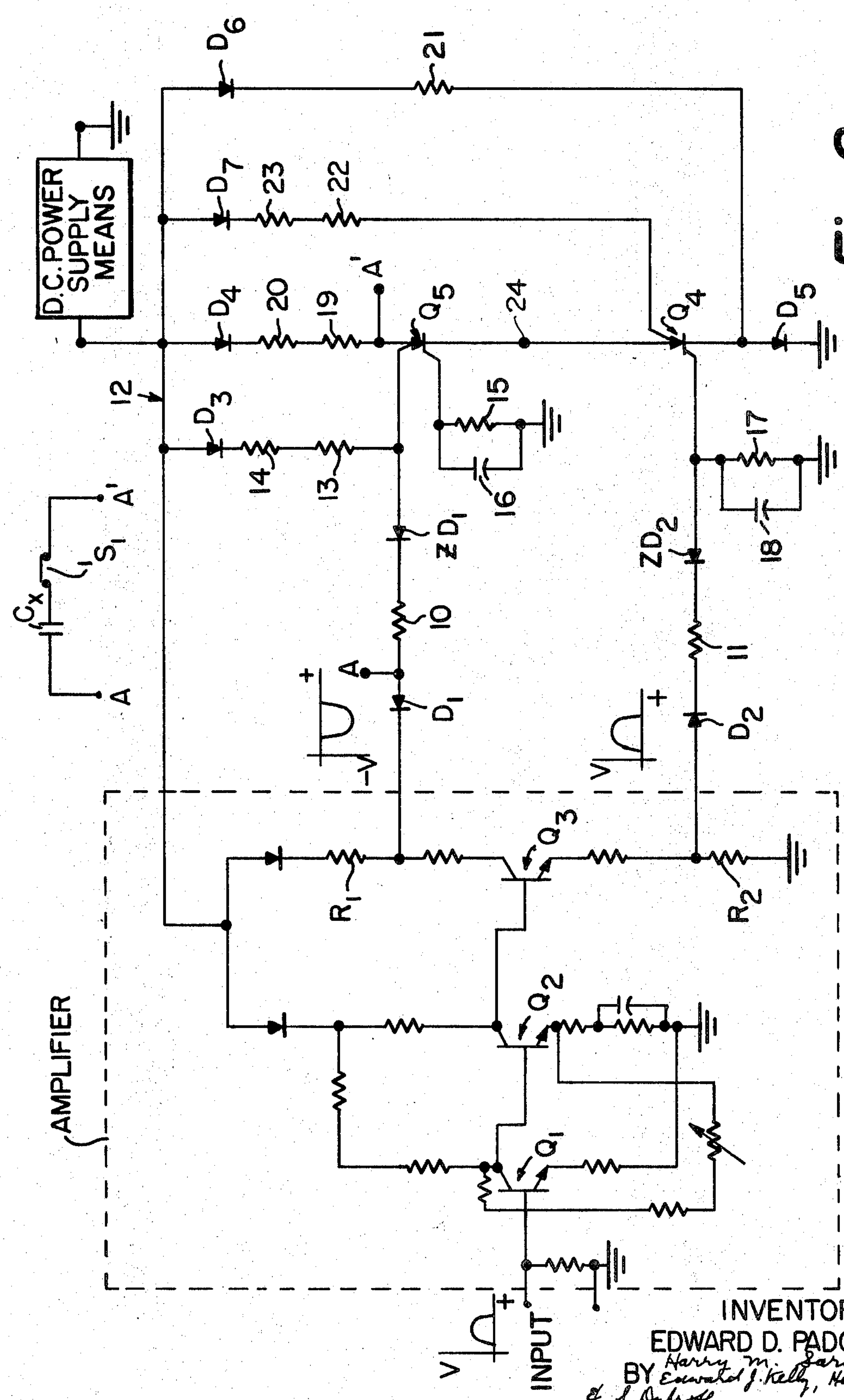

These and other features and advantages of the present invention will become apparent upon reading the following description in conjunction with the following drawings, in which FIG. 1 is a block diagram of a presently preferred embodiment of the invention utilizing silicon-controlled switches and three load devices; and FIG. 2 is a schematic circuit diagram of the preferred embodiment shown in FIG. 1.

Referring now to FIG. 1, the logic circuit is shown for the firing of three load devices, which firing is controlled by a pair of solid state or silicon controlled switches in series. This is a bridge type circuit, and is used as a basis for simplifying the explanation of the system which includes a pair of control devices comprising silicon-controlled switches connected in series. This is a distinct advantage over most prior art systems, since most semiconductors fail by short circuiting, a situation that creates havoc in parallel circuitry.

To selected electrodes of these silicon-controlled switches are connected the load circuits, shown here as loads 1, 2, and 3, by which arming, fuzing, safing or firing of adaption kits or other like devices is accomplished. In this present embodiment the switching devices remain passive and inert, and the junction properties of the switches provide an affirmative blocking action to prevent the load circuits from conducting until the appropriate coded commands or pulses are received. This system remains passive even though power supply voltage may be applied.

At an appropriate time, say before the firing of a warhead, a plurality of coded electric pulses of designated phases or polarities, shown here as a negative pulse, to the control device or unit SCS I and a positive pulse to the control device or unit SCS 2, are applied to the chosen control electrodes of the silicon controlled switch units. The appearance of designated pulses at the junctions of the SCS' devices or units causes the triggering thereof from the Off or nonconducting state, to the On or conducting state. This triggering action can be described as unblocking the junctions of the SCS units and thereafter allowing the PNPN or NPNP structure to conduct. The coded pulses may be obtained from the output resistors of a suitable amplifier or transistor, shown here for purposes of simplicity as resistors $R_1$ and $R_2$.

More specifically, the negative pulse is applied to the selected electrode of the control device No. 1 at the same time as a positive pulse is applied to the SCS 2 device to thereby allow both silicon-controlled switch units to trigger or be turned on. In turn, this switch closing permits the conduction of current by the load circuits, shown here as loads 1, 2, and 3, to achieve the desired function of an adaption kit for example. It is to be noted that the loads after being turned on, can be considered to be in parallel. Therefor, the block diagram of FIG. 1 can be considered to be the On equivalent circuit. In the prior state, that is the Off state of the control devices, the loads must be considered as open-circuited or blocked, and thus are completely safe.

The silicon-controlled switch devices are so chosen that they permit connection of three or more load circuits in this manner. For the above reasons the system can be thought to be one of "tri-ality." That is, either the series connection of the silicon controlled switch units to which the blocked loads are connected or the concept that a plurality of loads can be so connected and used with these silicon-controlled switch devices, suggest a triangle or three cornered affair to which the concept, or nomenclature or "tri-ality" can be applied. The term loads as used here is understood to include either the "hot" loads of an adaption kit as well as the monitoring loads or circuits for communication or telemetry data.

A safing function can be incorporated into the system which can prevent the entire system from firing, even on application of the coded input pulses. This is done by connecting a small capacitor, shown as capacitor $C_x$ in FIG. 1, from a selected one control electrode to a selected other control electrode of control device No. 1. The capacitor is connected in series with the contents of an environmental switch or switching device S1, such as a barro-switch, servo-switch, G-switch or setback switch, to provide a most valuable duding function. The circuit will not fire even if both pulses are applied until the switching device opens in response to a predetermined environmental condition, whereupon $C_x$ will be removed, and the mechanism will be armed and ready to fire upon receipt of both trigger pulses.

The concept used for the circuit, that is, a bridge circuit configuratiton, essentially eliminates spurious changes in voltage by allowing the system's elements to rise and fall with supply voltage variations, thus minimizing rate effects. As shown in FIG. 1, a resistor $R_{bal}$ denotes the source impedance or balancing resistor of an amplifier. The left arm of the bridge consists of circuit resistors $R_1$ and $R_2$. The right arm of the bridge consists of the series connected semiconductor control devices.

Referring now to FIG. 2 of the drawing, a schematic circuit diagram of the preferred embodiment is shown. The conditioned amplifier of the present device is shown inclosed in dotted line, and comprises three direct coupled transistors, $Q_1$, $Q_2$ and $Q_3$. In accordance with the copending application of the same inventor, filed concurrently herewith, entitled "Semi-Conductor Control Circuit," Ser. No. 678,462, filed Oct. 26, 1967, there is described the preferred amplifier of the present inventive device. The present invention relates to a novel circuit arrangement for such an amplifier, and as such, the amplifier will be only briefly discussed.

The pulse amplifier uses several stages of transistor, direct coupled amplification. The output stage acts as a phase inverter to provide coded pulses of proper plurality, amplitude and width, at a preset time to achieve firing of the loads in the adaption kit. As shown, a pair of pulses is derived from transistor $Q_3$. One of the pulses is coded negative in polarity, while the other is positive.

The input signal to the base of $Q_1$ is shown as a positive going pulse which is preferably about 70 microseconds in duration and about 60 millivolts in amplitude. The outputs of the third stage as seen by a resistor load, will be as follows: the output pulse at the collector of the transistor $Q_3$, as seen by the resistor $R_1$ which can be approximately 1000 ohms, will be a negative going pulse of about 19 volts in magnitude and about 60 microseconds in width. The other output from the third stage, here the emitter of the transistor $Q_3$, will be a positive going pulse of about 5 volts in magnitude and about 45 microseconds in width, as seen across resistor $R_2$ which can be approximately 5 ohms.

The conditioning network of the amplifier, which will not be disclosed in detail here, establishes a threshold voltage value below which the circuit will not fire, and smoothes out or cancels any effects of voltage changes that otherwise would likely cause random or unwanted firing of the silicon controlled switch devices.

The two above-mentioned output voltages, that is, the negative and positive coded pulses, are applied, respectively, to the control gates of silicon controlled switches $Q_5$ and $Q_4$. The negative going pulse is applied to the anode gate of silicon controlled switch $Q_5$ through a diode $D_1$, a resistor 10 and a Zener diode $ZD_1$. The positive going pulse is applied to the cathode gate of the SCS $Q_4$ through a diode $D_2$, a resistor 11 and Zener diode $ZD_2$.

The anode gate of SCS $Q_5$ is also connected to a positive voltage supply line 12 of a DC power supply means through a load resistor 13, a resistor 14 and a diode $D_3$. The cathode gate of SCS $Q_5$ is connected to a bias potential reference point such as circuit ground, through a resistor 15 which is shunted by a capacitor 16. The cathode gate of SCS $Q_4$ is also connected to ground through a resistor 17 which is shunted by a capacitor 18.

The two SCS devices, $Q_4$ and $Q_5$, are connected in series, the anode of $Q_4$ being directly connected at point 24 to the cathode of $Q_5$. The anode of $Q_5$ is connected to the voltage supply line 12 through a second load resistor 19, a resistor 20, and a diode $D_4$. The cathode of SCS $Q_4$ is connected to circuit ground through a diode $D_5$. The cathode of SCS $Q_4$ is also connected to the voltage supply line 12 through a resistor 21 and a diode $D_6$. The anode gate of the SCS $Q_4$ is connected to the voltage supply line 12 through a third load resistor 22, a resistor 23 and a diode $D_7$.

As shown in FIG. 1, the entire system can be prevented from firing even on application of the necessary coded input pulses. This is done by connecting a small capacitor $C_x$ in series with an environmental responsive switch, $S_1$, for example, from junction point A to junction point A', as seen in FIG. 2.

In the operation of the control circuit of FIG. 2, it can be seen that by using the "tri-ality" logic configuration described above, a plurality of load devices, as used in adaption kits and "set-backs" for artillery shells, can be connected uniquely to a plurality of series connected SCS devices. Herein, resistors are used to simulate the load devices, which are to be fired or detonated by electric energy at preset times. The loads shown in FIG. 2 are the resistors 13, 19 and 22. Anyone of these loads could be used in either a monitoring circuit or setback circuit if desired. The resistor 15 in the cathode gate circuit of the SCS $Q_5$ can be used as an additional load or monitor resistor, but in the present process is used for other functions, such as adjustment of device sensitivity, setting triggering level and reducing transients. The capacitor 16 which is shunting resistor 15 serves the additional function of preventing the accidental firing of the SCS unit $Q_5$ which might be caused by fast rising voltage variation in the DC power supply means. In other words, the circuit of the resistor 15 and the capacitor 16 provides a fail-safe mechanism to minimize a "worst-case" situation of rapid voltage changes, to prevent unwanted or spurious firing of the SCS. The circuit comprising the resistor 17 and the capacitor 18 connected in the cathode gate circuit of the SCS $Q_4$ performs a similar process and function.

When the input pulses of designated time, code and plurality, shown as the negative and positive pulses in FIG. 2, appear at the aforementioned selected gates of the SCS devices $Q_4$ and $Q_5$, the SCS units are triggered into the On or conduction stage. The load circuits, shown here as resistors 13, 19 and 22, then act as though a normally open multiple throw-multiple pole mechanical switch had closed and had turned the circuit on, and allowed the loads to conduct as though they were originally in a parallel configuration. The schematic circuit diagram also shows that each load circuit includes a small buffering resistor, such as a resistor 14, resistor 20 and 23. The function of the resistor 20 is to prevent the voltage at the anode of SCS $Q_5$ from rising as fast as the gate voltages, and also to prevent it from rising above the supply voltage. The present preferred embodiment provides loads in parallel since in actual adaption kit applications several loads are used in parallel to increase the reliability and probability of a successful firing.

As previously disclosed, a larger negative pulse is applied directly to the anode gate of the SCS unit $Q_5$. The appearance of this coded pulse triggers or unblocks $Q_5$ while at substantially the same time, a positive going coded pulse is applied to the cathode gate electrode of the SCS unit $Q_4$ in order to switch $Q_4$ to the on or conducting state. If the positive pulse appears during or shortly after the larger and longer negative pulse, the entire circuit still operates reliably and effectively.

The application of the large and longer negative pulse acts as a preconditioner for the SCS device $Q_5$ and enables the junctions to reform or perform their proper functions in the event they have become scrambled, or have lost their identity due to age, nonuse, or had prior history of use or abuse. It also allows the SCS device to be triggered On, by a rapid modulation of charge stored at, near, or in the domains of the center junction; that is, the junction between the control gates of the semiconductor devices. Also, in a one shot situation, the larger negative pulse causes a very rapid decrease in the voltage at the anode gate electrode. This sudden change allows the junction to break down and to conduct.

The networks consisting of diode $D_1$, resistor 10 and Zener diode $ZD_1$, and diode $D_2$, resistor 11 and Zener diode $ZD_2$ serve to couple the respective input pulses to the silicon controlled switches as well as to provide isolation between the circuits and the amplifier. Diode $D_5$ in the cathode lead of SCS $Q_4$ is used to provide reverse bias to the cathode gates of the SCS $Q_4$ and $Q_5$ and to the base electrodes of the pulse amplifier to provide stability in operation. The reverse bias to the cathode gates of SCS devices $Q_4$ and $Q_5$ is also provided through the resistors 15 and 17.

From the foregoing description, it will be seen that the improved logic system and circuitry of the present invention has several features and operational characteristics which contribute to its success for arming, firing, fuzing and safing systems used in artillery shells and in missile adaption kts. Among these are (1) A pair of coded pulses must be applied to the silicon controlled switch devices to obtain a firing. If either pulse is missing, these configurations will not be fired. (2) A negative bias can be applied and the sensitivity and random triggering of the SCS units can be eliminated by connecting resistors, 15 and 17, in the cathode gate circuits. "Worst case" firing by voltage changes can be minimized by adding capacitors, 16 and 18, to shunt the above resistor. (3) A capacitor, $C_x$, can be connected to obtain an automatic duding of the system, even through trigger pulses may appear. This addition is a desirable process in some ordnance application as in artillery shells for example. (4) The silicon controlled switches are connected in a series configuration, and are used to fire adaption kit loads which appear to be connected in parallel, after the silicon controlled switches are switched On.

While the invention has been shown and disclosed with reference to a logic circuit with predetermined values and configurations it is obvious that the values of the circuit elements can be changed and certain modifications can be made in the circuitry.

I claim:

1. A logic circuit for use with adaption kits and other like devices in missiles for activation of warheads on programmed schedules, comprising in combination:

a plurality of serially connected normally nonconductive pulse responsive switches, each of said switch plurality having a plurality of electrodes;

means providing postive triggering pulses to a selected electrode of one switch of said switch plurality and further providing negative triggering pulses to a selected electrode of another switch of said switch plurality; and a plurality of parallel-configured load means connected to selected electrodes of said switch plurality, said load means plurality being rendered operative to pass current therethrough only upon the receipt by said switch plurality of said positive and negative triggering pulses.

2. A logic circuit as defined in claim 1, wherein safing means including a normally-closed switch and a serially connected capacitor are connected across selected electrodes of said switch plurality to thereby prevent said switch plurality from conducting, and wherein means are provided for causing said normally-closed switch to open in response to predetermined environmental condition.

3. A logic circuit, comprising in combination:

signal output means providing coded positive and negative pulses:

a first solid state switch having a first anode, cathode and anode gate electrodes;

a second solid state switch having second anode, cathode, anode gate and cathode gate electrodes;

a first two-terminal load means, one terminal being connected to said first anode gate electrode;

a second two-terminal load means, one terminal being connected to said first anode electrode;

a third two-terminal load means, one terminal being connected to said second anode gate electrode;

means for providing operating voltage to the circuit including a positive direct-current power supply line connected with the remaining terminals of said load means and said second cathode electrode;

means for applying said negative coded pulse to said first anode gate electrode to render said first solid state switch conductive in response thereto;

and means for applying said positive coded pulse to said second cathode gate electrode to render said second solid state switch conductive in response thereto, whereby said load means are rendered conductive to pass current from said direct-current line upon said first and second switches respectively receiving substantially simultaneously said negative and positive coded pulses.

4. A logic circuit as defined in claim 3, wherein safing means including a capacitor and a normally-closed switch in series therewith are connected across said first anode and anode gtae electrodes thereby to prevent said first solid state switch from conducting in response to a coded pulse, and wherein means are provided for causing said normally-closed switch to open in response to a predetermined environmental condition.

5. A logic circuit, comprising in combination, first and second silicon controlled switches, said first switch at least having a cathode, an anode, and an anode gate electrode and said second switch at least having an anode, and anode gate, and a cathode gate electrode, the cathode of the first switch being connected to the anode of the second switch, and the anode gate of the first switch and the cathode gate of the second switch providing terminal connections for input signals of opposite polarity;

first, second and third lead means connected between a common terminal and the anode gate and anode of the first switch and the anode gate of the second switch respectively;

an amplifier providing negative and positive pulses respectively to said first switch anode gate and said second switch cathode gate; and means connected to said common terminal for providing current through said load means upon said switches being rendered conductive by said pulses.

6. A logic circuit as defined in claim 5, wherein a series connected capacitor and normally closed switch are connected between the anode and the input terminal connection of said first switch thereby to prevent said first switch from conducting in response to a negative input pulse, and wherein means are provided for causing said normally closed switch to open in response to a predetermined environmental condition.

7. A logic circuit as defined in claim 1, wherein;

said load means plurality is rendered operative to pass current only when said switch plurality receives said positive and negative triggering pulses substantially simultaneously.

8. A logic circuit as defined in claim 7, wherein:

each of said plurality of switches has anode, cathode, anode gate, and cathode gate electrodes; and two of said plurality of load means are connected one each to the anode and anode gate of one of said switch plurality and yet another of said load means plurality is connected to the anode gate of another of said switch plurality.

9. A logic circuit as defined in claim 7, wherein:

said positive and negative triggering pulses are received respectively by the cathode gate of one of said switch plurality and the anode gate of another of said switch plurality.

10. A logic circuit as defined in claim 9, wherein:

two of said load means plurality are connected to a first switch of said switch plurality, the anode gate of said first switch receiving said negative triggering pulses, and one of said load means plurality is connected to a second switch of said switch plurality, the cathode gate of said second switch receiving said positive triggering pulses.

References Cited

UNITED STATES PATENTS

| | | | |
|---|---|---|---|
| 3,100,268 | 8/1963 | Foote | 307—252 X |
| 3,109,971 | 11/1963 | Welch et al. | 307—252 X |

FOREIGN PATENTS

| | | |
|---|---|---|
| 917,382 | 2/1963 | Great Britain. |

OTHER REFERENCES

PUB I: "Applications and Circuit Design Notes" by Solid State Products, Inc., Bulletin D420-02-12-59 (Dated 12/1959), pp. 20 and 21 and FIG. 34 relied on.

STANLEY D. MILLER, Jr., Primary Examiner

U.S. Cl. X.R.

307—284, 305; 328—70